United States Patent
Khandros et al.

(10) Patent No.: US 7,253,651 B2
(45) Date of Patent: Aug. 7, 2007

(54) REMOTE TEST FACILITY WITH WIRELESS INTERFACE TO LOCAL TEST FACILITIES

(75) Inventors: Igor Y. Khandros, Orinda, CA (US); Benjamin N. Eldridge, Danville, CA (US)

(73) Assignee: FormFactor, Inc., Livermore, CA (US)

( * ) Notice: Subject to any disclaimer, the term of this patent is extended or adjusted under 35 U.S.C. 154(b) by 77 days.

(21) Appl. No.: 10/905,199

(22) Filed: Dec. 21, 2004

(65) Prior Publication Data

US 2006/0132161 A1  Jun. 22, 2006

(51) Int. Cl.
*G01R 31/28* (2006.01)
*G01R 31/02* (2006.01)
*G06F 17/50* (2006.01)

(52) U.S. Cl. .................. 324/763; 324/158.1; 324/765; 702/122; 702/188; 714/733; 714/734; 716/4

(58) Field of Classification Search ................ 324/763, 324/765; 714/733, 734; 702/122, 188; 716/4; 455/67.14, 115.2; 340/870.01
See application file for complete search history.

(56) References Cited

U.S. PATENT DOCUMENTS

| | | | |
|---|---|---|---|
| 6,236,223 B1* | 5/2001 | Brady et al. | 324/765 |
| 6,879,940 B1* | 4/2005 | Crist et al. | 702/188 |
| 2005/0060627 A1* | 3/2005 | Maltseff et al. | 714/733 |
| 2005/0086021 A1* | 4/2005 | Khandros et al. | 702/121 |
| 2005/0193294 A1* | 9/2005 | Hildebrant | 714/723 |
| 2006/0070014 A1* | 3/2006 | Liu et al. | 716/11 |

* cited by examiner

*Primary Examiner*—Ha Tran Nguyen
*Assistant Examiner*—Emily Y Chan
(74) *Attorney, Agent, or Firm*—N. Kenneth Burraston

(57) ABSTRACT

A central test facility transmits wirelessly test data to a local test facility, which tests electronic devices using the test data. The local test facility transmits wirelessly response data generated by the electronic devices back to the central test facility, which analyzes the response data to determine which electronic devices passed the testing. The central test facility may provide the results of the testing to other entities, such as a design facility where the electronic devices were designed or a manufacturing facility where the electronic devices where manufactured. The central test facility may accept requests for test resources from any of a number of local test facilities, schedule test times corresponding to each test request, and at a scheduled test time, wirelessly transmits test data to a corresponding local test facility.

36 Claims, 8 Drawing Sheets

_US 7,253,651 B2_

REMOTE TEST FACILITY WITH WIRELESS INTERFACE TO LOCAL TEST FACILITIES

BACKGROUND

This invention relates generally to testing devices, products, or articles of manufacture (hereinafter referred to collectively as "devices").

After being manufactured, most devices are subjected to at least some testing before being sold or incorporated into other products. For example, newly manufactured semiconductor dies may be subjected to one or more types of tests. For example, the dies may be subjected to wafer probing tests while still in wafer form. The dies may be subjected to further testing before or after being singulated and still further testing after being integrated into an electronics module. Such tests may be designed to determine whether the dies are good or bad, or the tests may be designed to rate the performance of the dies. As another example, semiconductor dies may be burned in, which may involve at least exercising the dies while subjecting the dies to elevated or reduced temperatures. As is known, burn in tends to accelerate the appearance of latent defects in the dies. (As used herein, the term "test" (or any form of the word "test") is intended to broadly cover any activity intended to rate a device or determine the operability or operating parameters of the device or whether the device is good or bad and thus includes, among other things, exercising the device during a process like burn in that is intended to accelerate failure of the device.)

No matter how a device is tested, there is a need to control efficiently the testing of the device. As described below, exemplary embodiments of this invention include a remotely located central test facility that efficiently controls testing at one or more local test sites.

BRIEF SUMMARY

The present invention relates generally to test systems and methods. In one exemplary embodiment, a central test facility transmits wirelessly test data to a local test facility, which tests newly manufactured devices (e.g., electronic devices) using the test data. The local test facility transmits wirelessly response data generated by the electronic devices back to the central test facility, which analyzes the response data to determine which electronic devices passed the testing and/or to rate the devices. The central test facility may provide the results of the testing to other entities, which may be remotely located. Such entities include a design facility where the devices were designed and a manufacturing facility where the devices were manufactured. The central test facility may provide the test results to such entities via wireless transmissions.

In another exemplary embodiment, a central test facility accepts requests for test resources from any of a number of local test facilities. The central test facility schedules test times corresponding to each test request. At a scheduled test time, the central test facility wirelessly transmits test data to a corresponding local test facility, which tests devices using the test data. The local test facility may transmit wirelessly response data generated by the devices back to the central test facility, which may analyze the response data to determine which devices passed the testing and/or to rate the devices.

DETAILED DESCRIPTION OF EXEMPLARY EMBODIMENTS

The present invention relates generally to testing devices. The present invention is, however, particularly suited for testing electronic devices (e.g., semiconductor dies). For ease of illustration and discussion, the exemplary embodiments are described herein as testing electronic devices. The invention is not, however, limited to testing electronic devices but is broadly applicable to testing any type of device. Indeed, although this specification describes exemplary embodiments and applications of the invention, the invention is not limited to these exemplary embodiments and applications or to the manner in which the exemplary embodiments and applications operate or are described herein.

Figure 1:
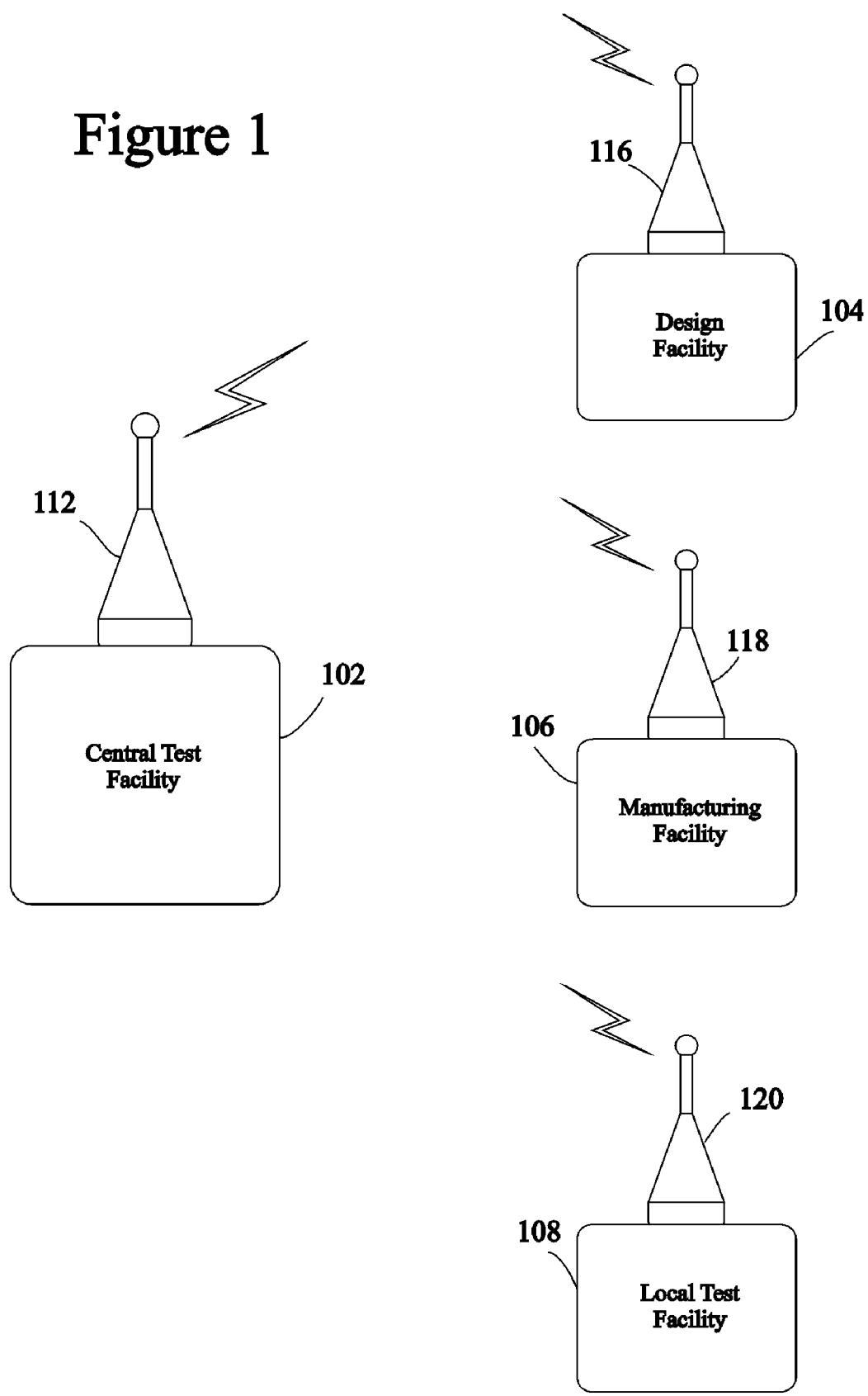
FIG. 1 illustrates an exemplary system for designing, manufacturing, and testing electronic devices.

FIG. 1 illustrates an exemplary system for designing, manufacturing, and testing electronic devices. As shown, the system includes a design facility 104, a manufacturing facility 106, a local test facility 108, and a central test facility 102. Electronic devices are designed at design facility 104, manufactured at manufacturing facility 106, and tested at local test facility 108. As discussed in more detailed below, the central test facility 102 may receive requests regarding testing of the electronic devices from the design facility 104, the manufacturing facility 106, and the local test facility 108. For example, the local test facility 108 may send a request for testing to the central test facility 102, which then schedules the requested testing and sends test data to the local test facility 108 to effect the testing. The design facility 104 and the manufacturing facility 106 may send requests for results of testing to the central test facility 102.

Central test facility 102 controls testing of the electronic devices at local test facility 108. As shown in FIG. 1, central test facility 102 may have a wireless transceiver 112 by which it communicates wirelessly with local test facility 108, which also includes a wireless transceiver 120. Design facility 104 and manufacturing facility 106 may also include wireless transceivers 116 and 118, respectively. Transceivers 112, 116, 118, and 120 may be any type of device for wirelessly transmitting and receiving data, and many such devices are well know. Such devices include devices for transmitting and receiving data via radio frequency transmissions (e.g., microwave devices) and devices for transmitting and receiving data via light transmission (e.g., laser light). Satellites and repeater stations may be employed for long distance transmissions. These and other devices for wirelessly transmitting and receiving data may be used.

Central test facility 102 may send wirelessly test data to local test facility 108 to initiate and control testing of the electronic devices at local test facility 108. Local test facility 108 may in turn wirelessly communicate test response data to central test facility 112, which may then send wirelessly the test response data or other data representing the results of testing the electronic devices to design facility 104 and/or manufacturing facility 106. The design facility 104 and/or the manufacturing facility 106 may then use the results of testing the electronic devices to modify the design or manufacture of the electronic devices to improve the yield or ratings of the devices.

The electronic devices designed, made, and tested using the exemplary system of FIG. 1 may be any type of electronic device, including semiconductor devices, which may be manufactured as dies on a wafer at manufacturing facility 106. Such dies may then be tested at local test facility 108 in wafer form. Alternatively, the dies may be singulated from the wafer and tested in singulated form, packaged or unpackaged. Of course, the dies may undergo some testing while in wafer form and some testing after being singulated from the wafer. The dies may also be assembled into modules, which are also tested.

Figure 2:
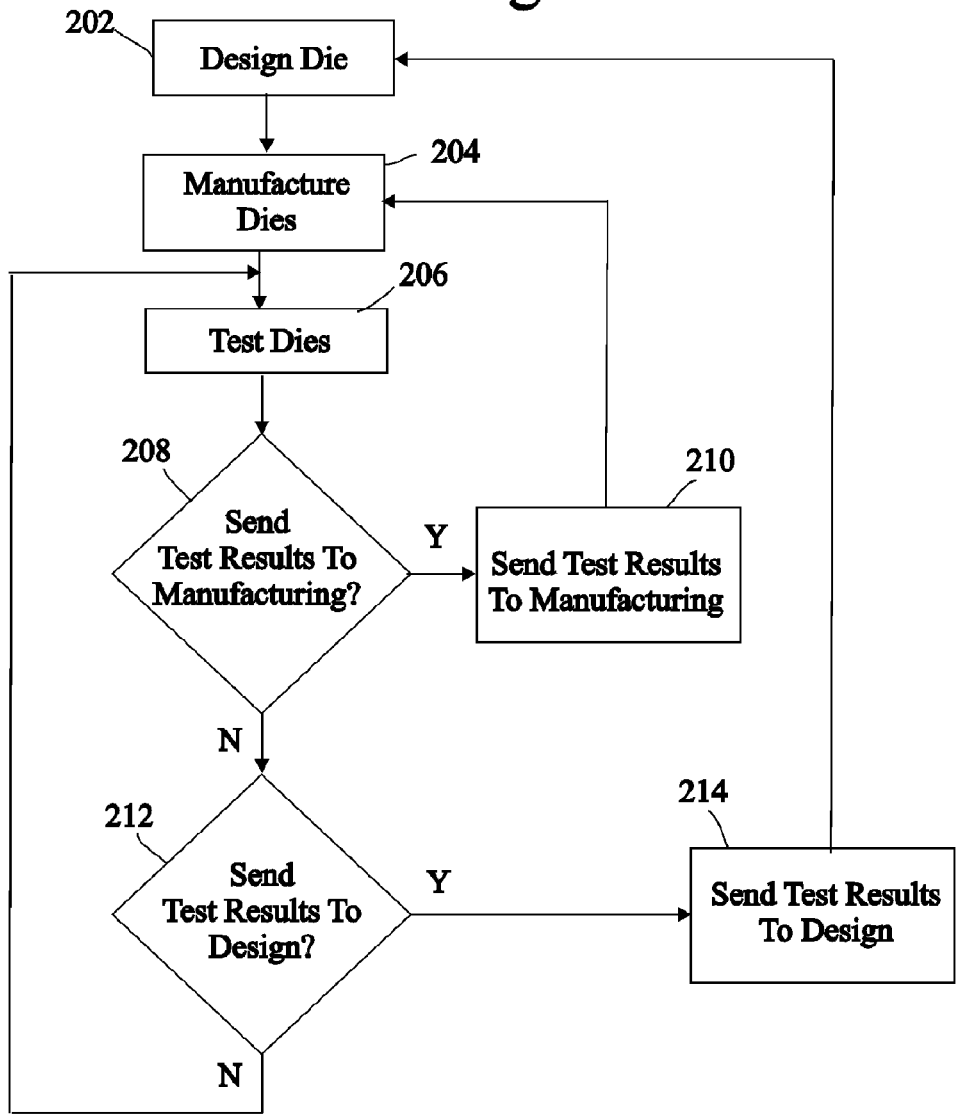
FIG. 2 illustrates exemplary operation of the system of FIG. 1.

FIG. 2 illustrates exemplary operation of the system of FIG. 1 in which the electronic devices designed, manufactured, and tested are semiconductor dies. At step 202, the die is designed at design facility 106. Many processes for designing semiconductor dies are know, and any suitable design process may be used. For example, the functional circuitry of the die may be designed, followed by floor planning and layout of the die, which produces a tape out. Once designed at step 202, dies are manufactured (step 204) at manufacturing facility 106. Again, many processes for manufacturing semiconductor dies are known, and any suitable manufacturing process may be used. Typically, semiconductor dies are manufactured many at a time on a semiconductor wafer.

The manufactured dies are then tested at step 206 at local test facility 108. There are many different types of tests that may be run on semiconductor dies, and any such tests may be run at step 206. For example, local test facility 108 may include probing equipment (e.g., a prober) for performing parametric and/or functional tests on semiconductor wafers. As another example, local test facility 108 may include equipment for testing singulated semiconductor dies, whether packaged or unpackaged, electronic modules comprising a plurality of electronic components, or other types of electronic devices. As yet another example, local test facility 108 may include equipment for burning-in or otherwise exercising the semiconductor dies with or without also testing the functionality of the dies while the dies are in wafer form, singulated but not packaged, singulated and packaged, or in other forms.

Central test facility 102 controls testing of the dies at local test facility 108, and thus, central test facility 102 and local test facility 108 together execute step 206 of FIG. 2. As mentioned above, central test facility 102 wirelessly transmits via transceiver 112 test data to local test facility 108, which receives the test data via its transceiver 120 and tests the dies in accordance with the test data. The test data may be any type of data suitable for testing the dies. For example, the test data may be commands that cause local test facility 108 to run specified tests on the dies, the test data may be test vectors to be written to the dies, or the test data may be a combination of test commands and vectors. The dies are tested at local test facility 108 in accordance with the test data from central test facility 102. Response data representing the results of testing the dies are wirelessly transmitted by local test facility 108 to central test facility 102. The response data may be in any suitable format. For example, the response data may be raw output data generated by the dies in response to the testing. As another example, the response data may represent a summary or analysis of the raw output data generated by the dies.

If it is determined at step 208 that test results are to be sent to the manufacturing facility 108, test results are sent to the manufacturing facility at step 210. Central test facility 102 wirelessly transmits the test results via transceiver 112, and manufacturing facility 106 receives the test results via its transceiver 118. Similarly, if it is determined at step 212 that test results are to be sent to the design facility 104, test results are sent to the design facility at step 214. Again, central test facility 102 wirelessly transmits the test results via transceiver 112, and design facility 104 receives the test results via its transceiver 116. The test results sent to the manufacturing facility 106 or the design facility 104 may be in any suitable form. For example, the test results may be raw data generated by the dies or may represent an analysis or summary of all or part of the testing of the dies.

Generally speaking, the test results may be used at the manufacturing facility 106 to alter the manufacture of the die in an attempt to improve the yield or rating of the dies. For example, if the test results show that the dies made on an identified area of the semiconductor wafers have a higher fail rate than dies made on other areas of the wafers, workers at the manufacturing facility 106 may take steps to improve the yield on the identified area of the wafer. For example, the workers may adjust the manufacturing equipment in order to improve the yield of dies on the identified area of the wafer. Alternatively, the workers may examine the batch of blank wafers at the manufacturing facility 106 for defects in the identified area. These are just two exemplary ways in which the workers may take steps to improve the yield on the identified area of the wafer Likewise, designers at the design facility 104 may use test results to improve the yield or rating of manufactured dies. For example, the designers may move the location of circuits or subcircuits in the layout of the dies. As another example, designers may change the design rules to which the design of the dies adheres.

Figure 3:
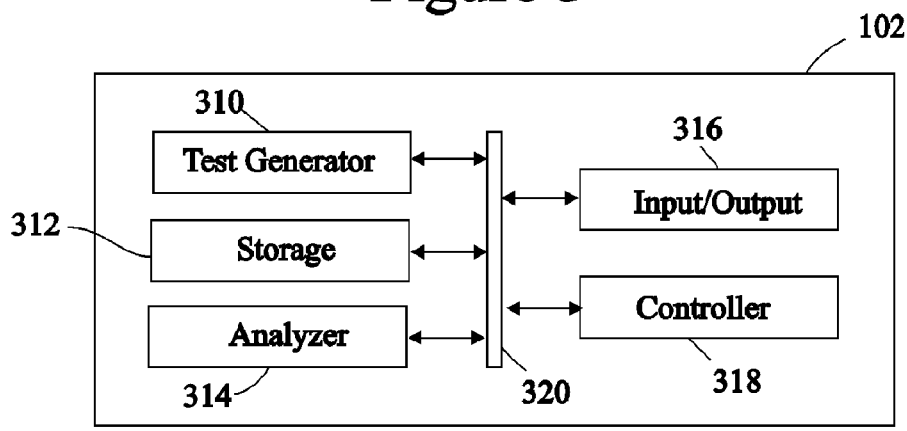
FIG. 3 illustrates a simplified block diagram of an exemplary implementation of the central test facility 102 of FIG. 1.
Figure 4:
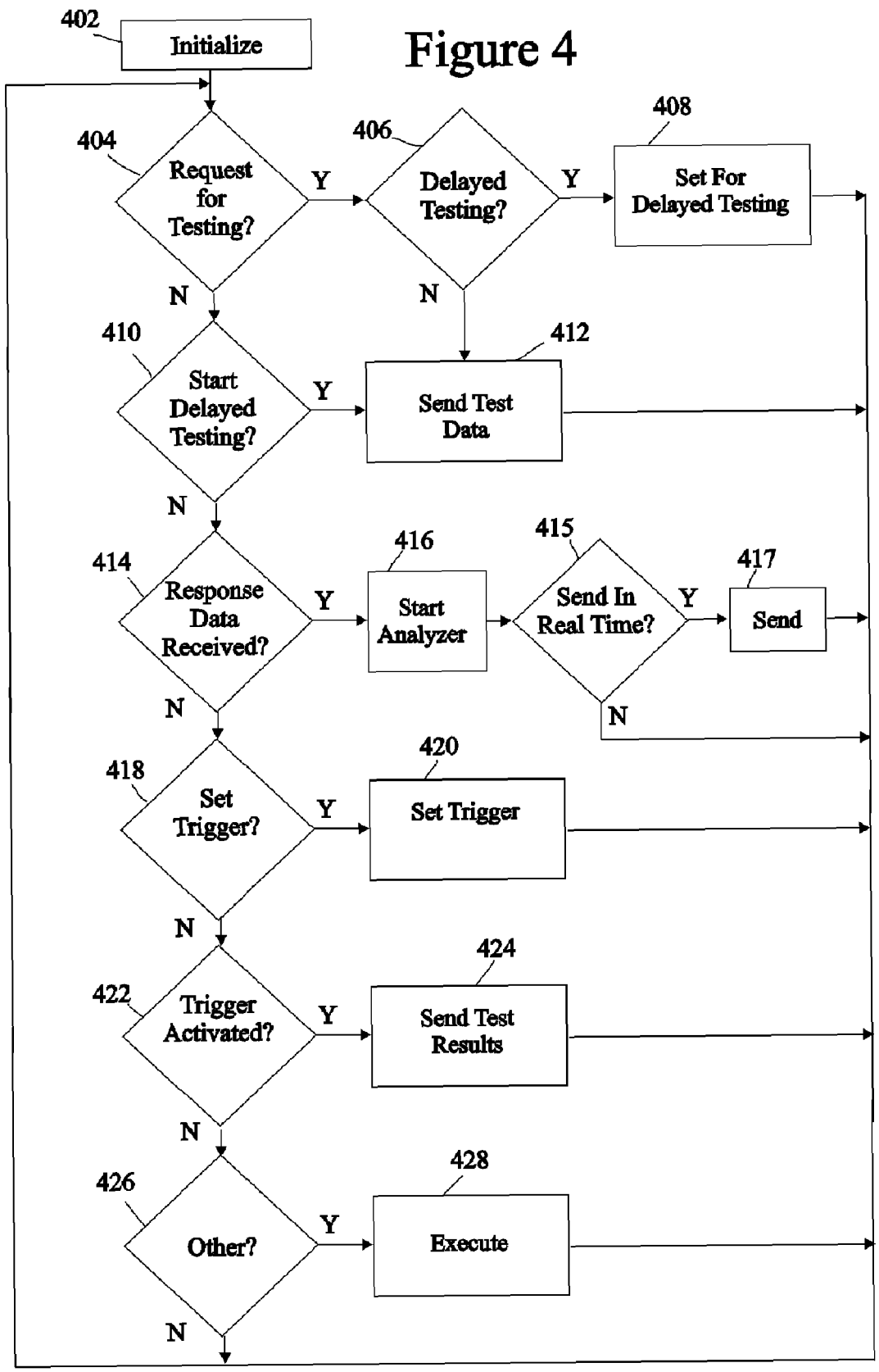
FIG. 4 illustrates exemplary operation of the controller 318 of FIG. 3.
Figure 5:
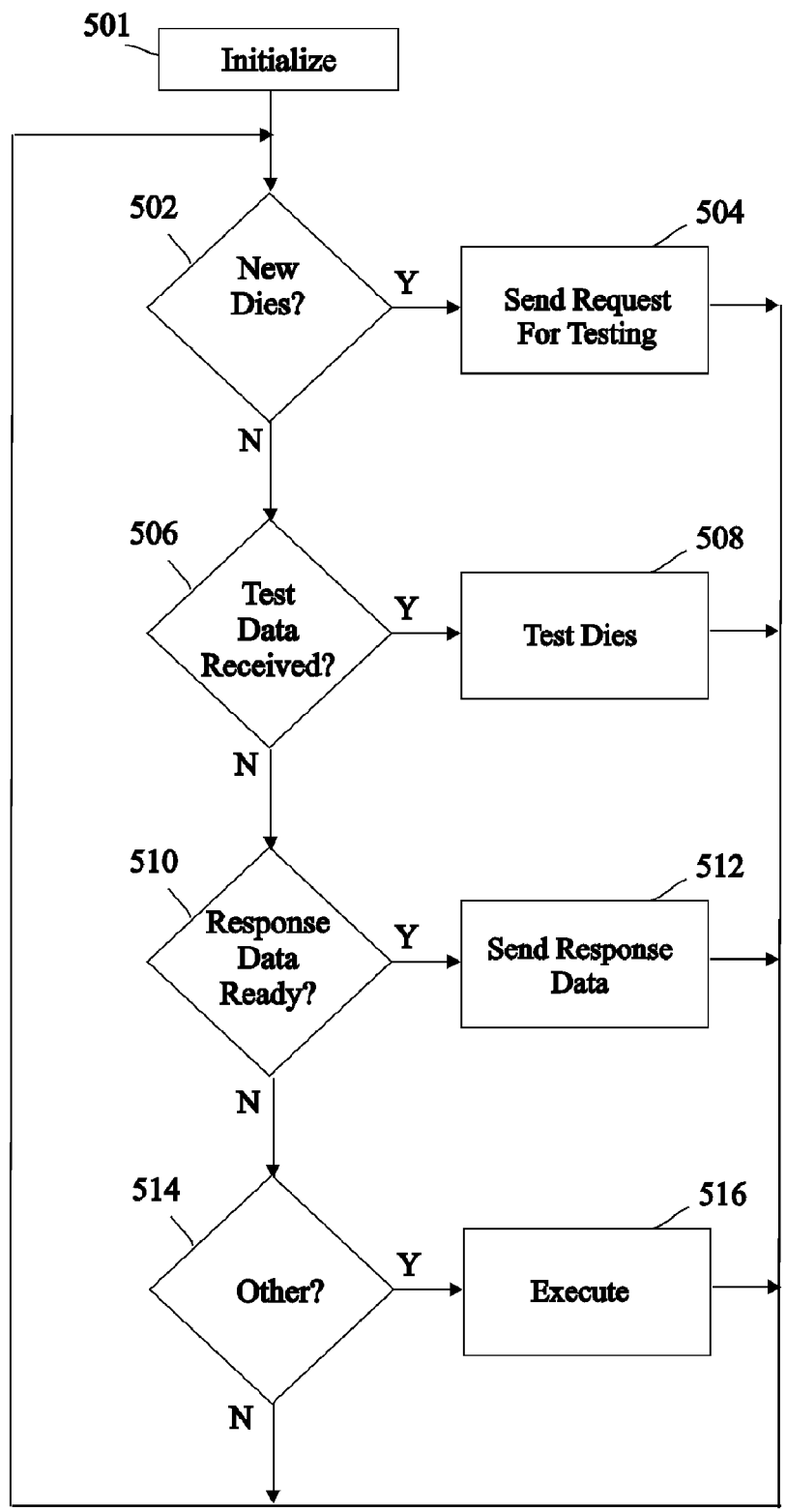
FIG. 5 illustrates exemplary operation of local test facility 108 of FIG. 1.
Figure 6:
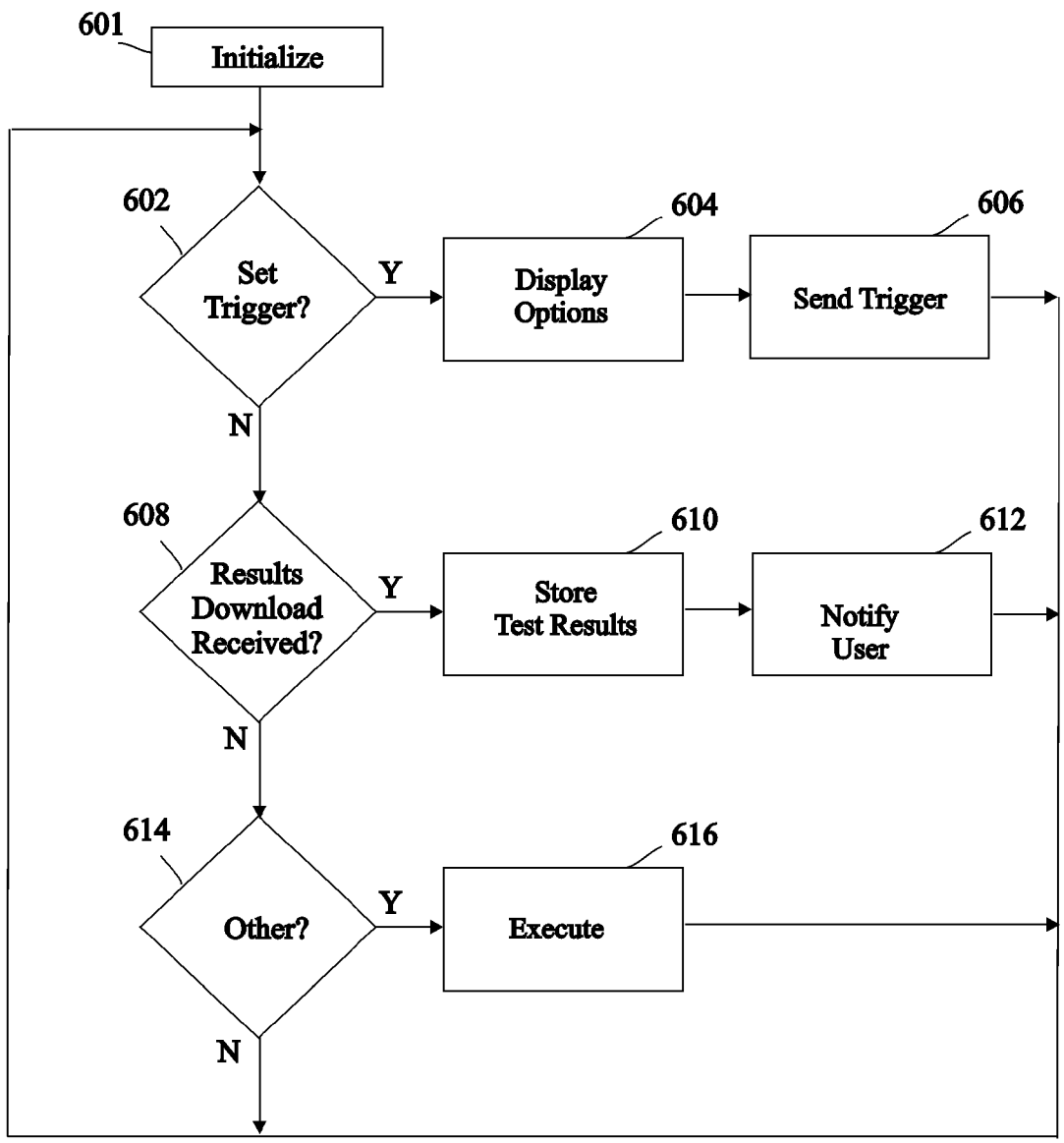
FIG. 6 lustrates exemplary operation of either the design facility 104 or the manufacturing facility 106 of FIG. 1.

FIG. 3 illustrates a simplified block diagram of an exemplary central test facility 102, and FIG. 4 illustrates exemplary operation of the controller 318 in the central test facility 102. FIG. 5 illustrates exemplary operation of a local test facility 108 in interacting with central test facility 102, and FIG. 6 illustrates exemplary operation of either the design facility 104 or the manufacturing facility 106 also in interacting with the central test facility 102.

Turning first to FIG. 3, controller 318 controls overall operation of central test facility 102. Controller 318 may be a microprocessor or a microcontroller operating under software (e.g., software, microcode, firmware, etc.) control, hardwired logic, or a combination of software and hardwired logic. Alternatively, controller 318 may be a computer or a system of computers. Input/output module 316 provides for the input and output of signals through transceiver 112 as well as other devices for transmitting or receiving data signals. Communications bus 320 allows the entities of central test facility 102 to communicate one with another.

Test generator 310 generates test data that is sent to the local test facility 108 for testing the dies at the local test facility 108. Analyzer 314 analyzes response data generated at the local test facility 108 by the dies in response to test data generated by the test generator 310. Like the controller 318, the test generator 310 and the analyzer 314 may be microprocessors or microcontrollers operating under software control, hardwired logic, or a combination of software and hardwired logic. Indeed, the test generator 310 and the analyzer 314 may themselves be computers or a group of computers. Input/output module 316 may be similar.

Storage 312 may be any type of data storage device, including without limitation a semiconductor based storage device or devices (e.g., random access memory ("RAM") or read only memory ("ROM"), a magnetic-based storage device or devices (e.g., a disk or floppy drive or a tape), an optical-based storage device or devices (e.g., a compact disk), any other type of storage device for storing data electronically, or any combination of the foregoing. A variety of data may be stored in storage 312, including without limitation software to be run on controller 318, the test generator 310, or the analyzer 314; data received via input/output module 316; etc. The controller 318, test generator 310, or the analyzer 314 may also include storage (not shown) for software, data, etc.

As mentioned above, FIG. 4 illustrates exemplary operation of controller 318, which may be implemented in software, hardwired logic, or a combination of software and hardwired logic. At step 402, controller 318 may initialize central test facility 102. Thereafter, as shown in FIG. 4, controller 318 looks for and responds to any of a variety of possible messages. FIG. 4 shows five exemplary messages that controller 318 may look for and process: a request-for-testing message (steps 404, 406, 408, 410, and 412), a start-delayed-testing message (steps 410 and 412), a response-data-received message (steps 414, 415, 416, and 417)), a set-trigger message (steps 418 and 420), and a trigger-activated message(steps 422 and 424). Each of these exemplary messages and the way in which the messages are processed in FIG. 4 will now be described.

The request-for-testing message represents a request from local test facility 108 for test data to test newly manufactured dies. This message is generated by local test facility 108 and sent to central test facility 102. Such a message may request immediate testing of the new dies or delayed testing (that is, testing that is to begin at a specified future date and time). A request-for-testing message may identify the type of dies to be tested or may simply request a particular type of testing. If controller 318 detects a request-for-testing message at step 404, controller determines at step 406 whether the request is for delayed testing. If yes, the controller schedules at step 408 testing to begin on the date and at the time requested. Controller may do so by using internal scheduling software. Processing of step 408 could also include additional sub-steps, such as finding an alternative testing time if the requested time is already scheduled, and sending notice of the alternative testing time to local test facility 108.

If the request-for-testing message was not for delayed testing (but was for immediate testing), controller 318 branches from step 406 to step 412. At step 412, controller 318 starts test generator 310, which then generates test data and sends the test data to local test facility 108. As discussed above, test generator 310 generates test data, and sends the test data via input/output module 316 and transceiver 112 to local test facility 108. As also discussed above, the test data may be test vectors, test commands, or a combination of test vectors and test commands. Whether the test data consists of test vectors, test commands, or a combination of both, test generator 310 may generate the test data by reference to a data table stored in storage 312.

Table I below illustrates an example of such a data table.

TABLE I

| Die Type | Test Vectors |
|---|---|
| "X" | X Test Vector 1 |
|  | X Test Vector 2 |
|  | X Test Vector 3 |
| "Y" | Y Test Vector 1 |
|  | Y Test Vector 2 |
| "Z" | Z Test Vector 1 |
|  | Z Test Vector 2 |
|  | Z Test Vector 3 |

In the example shown in Table I, central test 102 supports testing of three die types (X, Y, and Z), and the test data for each die type consists of a series of test vectors. If the request-for-testing message detected at step 404 identifies die-type X as the type of dies to be tested, test generator 310 writes X Test Vector 1, X Test Vector 2, and X Test Vector 3 to input/output module 316, which sends those three test vectors to local test facility 108. Similarly, if the die type is "Y," test generator 310 writes Y Test Vector 1 and Y Test Vector 2 to input/output module 316, which sends those two test vectors to local test facility 108. Similarly, if the die type is "Z," test generator 310 writes Z Test Vector 1, Z Test Vector 2, and Z Test Vector 3 to input/output module 316, which sends those three test vectors to local test facility 108. As will be seen, local test facility 108 receives the test vectors and writes the test vectors to the dies to be tested. The data table shown in Table I could, alternatively, contain a list of test commands that correspond to each die type rather than a list of test vectors. Moreover, a data table with die types and corresponding test vectors or test commands is only one of many possible ways in which test generator 310 may be configured to generate and send test data at step 412.

At step 410, controller 318 determines whether there is a start-delayed-testing message. A start-delayed-testing message is generated internally by the controller 318 when the time has arrived for delayed testing, as previously scheduled at step 408, to begin. If controller 318 detects such a message at step 410, controller 318 processes step 412 as described above.

At step 414, controller 318 determines whether there is a response-data-received message. As described above, in response to test data generated and sent at step 412 to the local test facility 108, the dies at the local test facility 108 generate response data. The local test facility 108 transmits this response data through its transceiver 120 to central test 102, which is received by central test facility's transceiver 112 and decoded by input/output module 316. (See also step 512 in FIG. 5, which describes operation of local test facility 108 and is discussed below.) Upon receiving and decoding response data from local test facility 108, input/output module 316 generates a response-data-received message, which controller 318 detects at step 414.

If the receipt of response data is detected at step 414, controller 318 activates analyzer 314 to analyze the response data. As discussed above, the response data may be in any format, such as raw response data or a summary of the response data generated at the local test facility 108. How the analyzer 314 analyzes the data will depend on the format of the data, among other things. Table II illustrates one exemplary way in which analyzer 314 utilizes a table of expected responses to analyze the actual response data generated by a die.

TABLE II

| Die Type | Expected Response |
|---|---|
| "X" | X Expected Response 1 |
| | X Expected Response 2 |
| | X Expected Response 3 |
| "Y" | Y Expected Response 1 |
| | Y Expected Response 2 |
| "Z" | Z Expected Response 1 |
| | Z Expected Response 2 |
| | Z Expected Response 3 |

As in the example discussed above and illustrated in Table I above, the example shown in Table II, assumes that the central test facility 102 supports testing of three die types (X, Y, and Z). In response to the input of the test vectors shown in Table I, analyzer 314 expects the responses shown in Table II. Thus, in the example shown in Table II, analyzer expects an "X" type die to produce response data consisting of X Expected Response 1, X Expected Response 2, and X Expected Response 3. The analyzer 314 compares the actual response data from an "X" type die to the expected response data stored in Table II: X Expected Response 1, X Expected Response 2, and X Expected Response 3. If the actual response data matches the expected response data, the die passes the test. Otherwise, the die does not pass the test. Analyzer 314 makes similar comparisons for "Y" and "Z" type dies, using the expected response Y Expected Response 1 and Y Expected response 2 or Z Expected Response 1, Z Expected Response 2, and Z Expected Response 3. Of course, however, use of a table with expected responses, such as Table II, is but one of many possible ways in which analyzer 314 may be configured to analyze response data generated by the dies at local test facility 108. Moreover, tests other than pass-fail tests may be performed on the dies. For example, tests for rating the operating speed of a die may be performed, in which case analyzer 314 would be configured to use response data to categorize the operating speed of each die. Regardless of the type of analysis analyzer 314 performs, analyzer 314 may store the test results in storage 312.

At step 415, it is determined whether test results—the analysis of the response data produced by analyzer 416—should be sent to one or more of the design facility 104 or manufacturing facility 106. Indeed, the rest results could even be sent back to the local test facility 108. This determination could be made by determining if any of the facilities 104, 106, or 108 has requested real-time delivery of test results. If so, the test results are sent to the requestor at step 417. It should be noted that a copy of the unanalyzed response data received from the local test facility 108 could be sent to the design facility 104 or the manufacturing facility 106 before the response data is analyzed at step 416. As yet another alternative, response data may be sent by the local test facility 108 directly to one or more of the design facility 104 or the manufacturing facility 106 before, at the same time as, or after the response data is sent from the local test facility 108 to the central test facility 102. Of course, the response data could be sent to the design facility 104 and/or the manufacturing facility 106 rather than the central test facility 102.

At step 418, controller 318 determines whether central test facility 102 has received a set-trigger message from the design facility 104 or the manufacturing facility 106. A trigger describes a condition that, when met, causes central test facility 102 to send specified test results to the requester (e.g., the design facility 104 or the manufacturing facility 106). If a set-trigger message is detected at step 418, the trigger is set at step 420, which may be done by storing a description of the trigger, the type of test results data requested upon activation of the trigger, and the entity to which the test results are to be sent.

Any type of trigger may be used. For example, a trigger may be set to activate after a specified number of dies on a single wafer fail testing. As another example, a trigger may be set to activate after a specified number of dies fail on a specified number of wafers. As yet another example, a trigger may be set to activate after a specified number of dies are rated below a given operating speed. At step 422, controller 318 determines whether the conditions of any stored trigger have been met, and if so, the controller 318 retrieves from storage 312 the test results specified for the trigger and sends the retrieved results to the entity that requested the trigger (e.g., design facility 104 or manufacturing facility 106) at step 424.

Steps 426 and 428 represent detection and processing of other messages. For example, the design facility 104 or the manufacturing facility 106 may send to central test facility 102 a request for specified test results data. As another example, a stop message and an interrupt message that ends and pauses, respectively, processing of the method shown in FIG. 4 may be detected and processed at steps 426 and 428.

FIG. 5 illustrates exemplary operation of local test facility 108, showing in particular, how local test facility 108 may interact with central test facility 102. The method of FIG. 5 may be executed by a controller, computer, or processor (not shown) at local test facility 108, and FIG. 5 may be implemented in software, hardware, or a combination of software and hardware. As shown, the method of FIG. 5 begins with general initialization at step 501 and thereafter consists primarily of looking for and processing messages. Three exemplary messages are shown in FIG. 5: a new-dies message (steps 502 and 504), a test-data-received message (steps 506 and 508), and a response-data-ready message (steps 510 and 512). Each of these exemplary messages and the way in which the messages are processed in FIG. 5 will now be described.

The local test facility 108 internally generates a new-dies message when new dies are brought to the local test facility and are ready for testing. If a new-dies message is detected at step 502, local test facility 108 sends a request-for-testing message at step 504 to central test facility 102. As discussed above, central test facility 102 detects and processes a request-for-testing message at steps 404 and 406 and one of steps 408 or 412 in FIG. 4. As also discussed above, the request-for-testing message may request immediate (or as-soon-as-available) testing or delayed testing. Although not shown in FIGS. 4 or 5, further messages may be exchanges, such as messages that confirm the requested test time is available or propose another time for testing.

A test-data-received message indicates that test data for testing dies at local test facility 108 have been received from central test facility 102. As discussed above, central test facility 102 sends test data at step 412 of FIG. 4. In response to detecting a test-data-received message at step 506 of FIG. 5, local test facility 108 uses the received test data to test one or more of the dies at local test facility 108 at step 508. As mentioned above, the test data may be test vectors, in which case the local test facility 108 writes the test data to the specified locations in the dies. If the test data are test commands, the local test facility 108 processes the test commands and thereby tests the dies. For example, the test commands may cause the local test facility 108 to generate specified test vectors, which are then written to the dies.

The dies at the local test facility 108 respond to the test data by generating response data. When such response data is generated by the dies, the local test facility 108 internally generates an internal response-data-ready message. If a response-data-ready message is detected at step 510, local test facility 108 sends the response data to central test facility 102 at step 512.

Steps 514 and 516 represent detection and processing of other or miscellaneous messages, including a stop message and an interrupt message that ends and pauses, respectively, processing of the method shown in FIG. 5.

FIG. 6 illustrates exemplary operation of either design facility 104 or manufacturing facility 106, again showing in particular how design facility 104 or manufacturing facility 108 may interact with central test facility 102. The method of FIG. 6 may be executed by a controller, computer, or processor (not shown) at the design facility 104 or the manufacturing facility 106, and FIG. 6 may be implemented in software, hardware, or a combination of software and hardware. The method of FIG. 6 may begin with general initialization at step 601 and thereafter consists primarily of looking for and processing messages. Two exemplary messages are shown in FIG. 6: a set-trigger message (steps 602, 604, and 606) and a results-download message (steps 608, 610, and 612). Each of these exemplary messages and the way in which the messages are processed in FIG. 6 will now be described.

The design facility 104 or manufacturing facility 106 internally generates a set-trigger message when a user (at the design facility 104 or the manufacturing facility 106) indicates that he or she would like to set a trigger for sending test results data to the facility. (Triggers are discussed above with respect to FIG. 4.) If a set-trigger message is detected at step 602, the user is prompted for input describing the trigger. For example, the user may be prompted to enter such input as the criteria that activates the trigger and the test results data desired upon activation of the trigger. At step 606, a request for the trigger is sent to the central test facility 102. As discussed above, the central test facility 102 detects and processes such a set-trigger message at steps 418 and 420 in FIG. 4.

A results-download-receive message indicates that test results have been received from the central test facility 102. For example, the test results may have been sent by the central test facility at step 424 of FIG. 4. At step 610, the test results are stored locally at the design facility 104 or manufacturing facility 106, and a user at the design facility 104 or manufacturing facility 106 is notified at step 612.

Steps 614 and 616 represent detection and processing of other or miscellaneous messages, including a stop message and an interrupt message that ends and pauses, respectively, processing of the method shown in FIG. 6.

It should be apparent that all communications among the design facility 104, manufacturing facility 106, local test facility 108, and central test facility 102, may be made wirelessly via transceivers 112, 116, 118, and 120.

Figure 7:
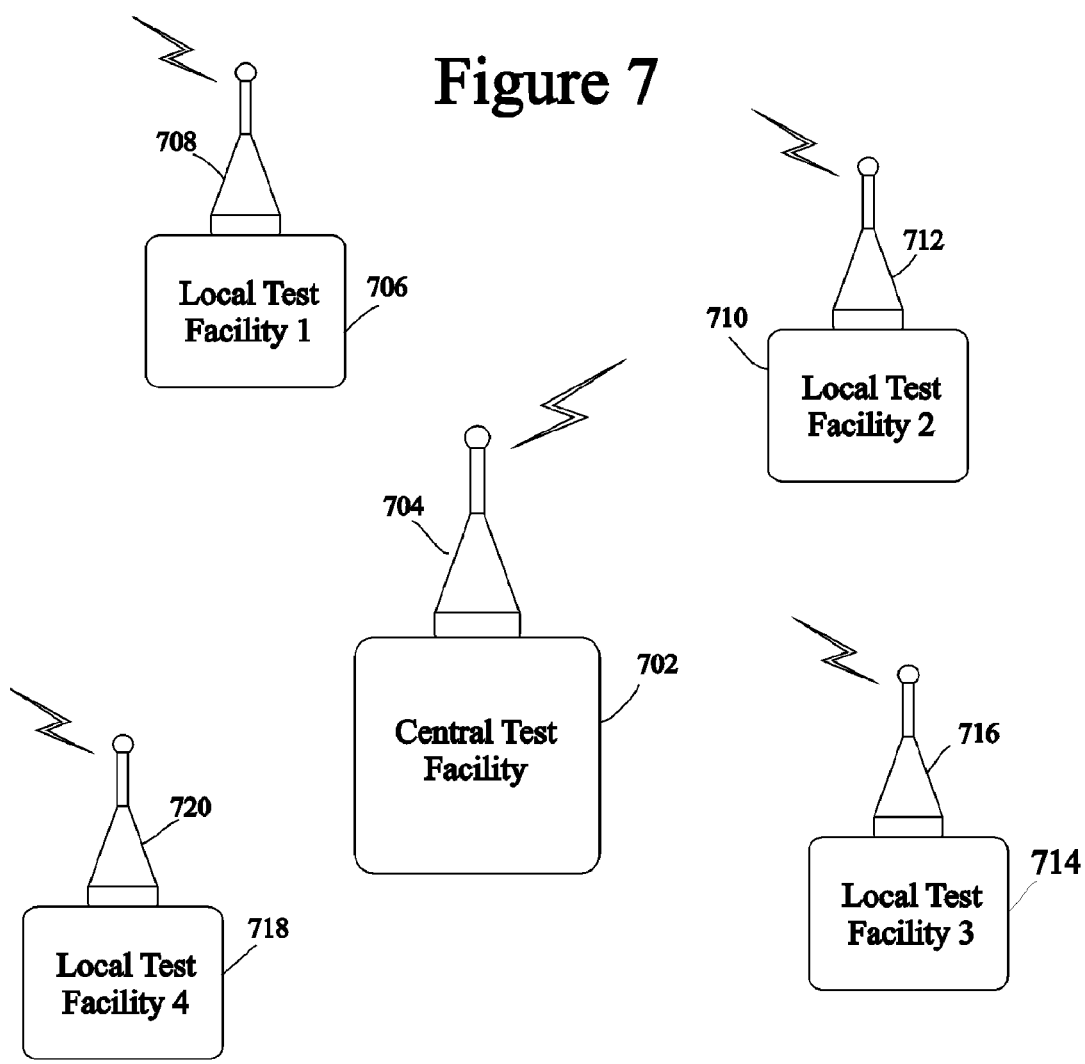
FIG. 7 illustrates another exemplary system for testing electronic devices.

FIG. 7 illustrates another exemplary system, which may be used to test electronic devices, such as semiconductor dies. As shown, the system of FIG. 7 includes a central test facility 702 and several local test facilities (four are shown, 706, 710, 714, and 718). The central test facility 702 includes a wireless transceiver 704, and each of the local test facilities 706, 710, 714, and 718 also include wireless transceivers 708, 712, 716, and 720. Wireless transceivers 708, 712, 716, and 720 allow each of the local test facilities 706, 710, 714, and 718 to wirelessly communicate with the central test facility 702. Each of the wireless transceivers 704, 708, 712, 716, and 720 may be similar to the wireless transceivers shown in FIG. 1 and discussed above.

As will be seen, central test 702 provides test resources to local test facilities 706, 710, 714, and 718, each of which may be generally similar to local test facility 108 shown in FIG. 1 and described above. The local test facilities 706, 710, 714, and 718 may be independent one from another and may include different types of equipment for testing different types of electronic devices. For example, any of the local test facilities 706, 710, 714, and 718 may include probing equipment (e.g., a prober) for performing parametric and/or functional tests on semiconductor wafers. As another example, a local test facility 706, 710, 714, or 718 may include equipment for testing singulated semiconductor dies, whether packaged or unpackaged, electronic modules comprising a plurality of electronic components, or other types of electronic devices. As yet another example, a local test facility 706, 710, 714, or 718 may include equipment for burning-in or otherwise exercising an electronic device with or without also testing the functionality of the electronic device.

Figure 8:
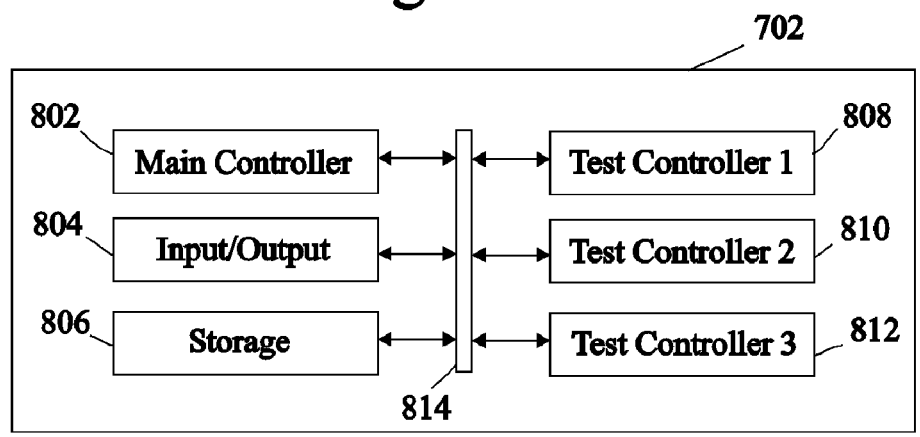
FIG. 8 illustrates a simplified block diagram of an exemplary implementation of central test facility 702 of FIG. 7.

FIG. 8 illustrates a simplified block diagram of an exemplary central test facility 702. As shown, FIG. 8 includes a main controller 802, three test controllers 808, 810, and 812, an input output module 804, data storage 806, and a communications bus 814.

Main controller 802 controls overall operation of central test facility 702. Like controller 318 in FIG. 3, main controller 802 may comprise a processor configured to operate under software control. The software may be stored in storage 806 or in other digital storage not shown in FIG. 8, such as a memory that composes main controller 802. Alternatively, main controller may comprise hardwired logic circuits or a combination of a processor and software and hardwired logic circuits. Main controller 802 may also comprise a computer.

As also shown in FIG. 8, central test facility 702 may include one or more test controllers. For illustration purposes and not by way of limitation, three test controllers—test controller 1808, test controller 2 810, and test controller 3 812—are shown in FIG. 8. As will be seen, test controllers 808, 810, and 812 control testing at a local test facility (e.g., local test facility 706, 710, 714, or 718). A test controller (e.g., 808, 812, or 812) may do so by sending test data to and then collecting response data from the local test facility (e.g., local test facility 706, 710, 714, or 718). As will also be seen, the test controller may also analyze the response data to determine whether the dies being tested at the local test facility pass testing or to rate the dies.

Input/output module 804 and storage 806 may be similar to input/output module 316 and storage 312, respectively, in FIG. 3. That is, input/output module 804 controls wireless transmission of data via transceiver 704, which may be transmitted to any of the transceivers 708, 712, 716, and/or 720 of the local test facilities 706, 710, 714, and/or 718. Input/output module 804 likewise controls receipt of data at transceiver 704, which may have been wirelessly transmitted from any of the transceivers 708, 712, 716, and/or 720 of the local test facilities 706, 710, 714, and/or 718.

Like, storage 312 of FIG. 3, storage 806 may be any type of data storage device, including without limitation a semiconductor based storage device or devices (e.g., random access memory ("RAM") or read only memory ("ROM"), a magnetic-based storage device or devices (e.g., a disk or floppy drive or a tape), an optical-based storage device or devices (e.g., a compact disk), any other type of storage device for storing data electronically, or any combination of the foregoing. A variety of data may be stored in storage 806, including without limitation software to be run on main controller 802 and/or any of test controllers 808, 810, or 812, or input/output module 804. Other data that may be stored in storage 806 includes test data to be sent to dies in any of the local test facilities 706, 710, 714, or 718, expected response data, and the results of any such testing. Other types of data may also be stored in storage 806.

Figure 9:
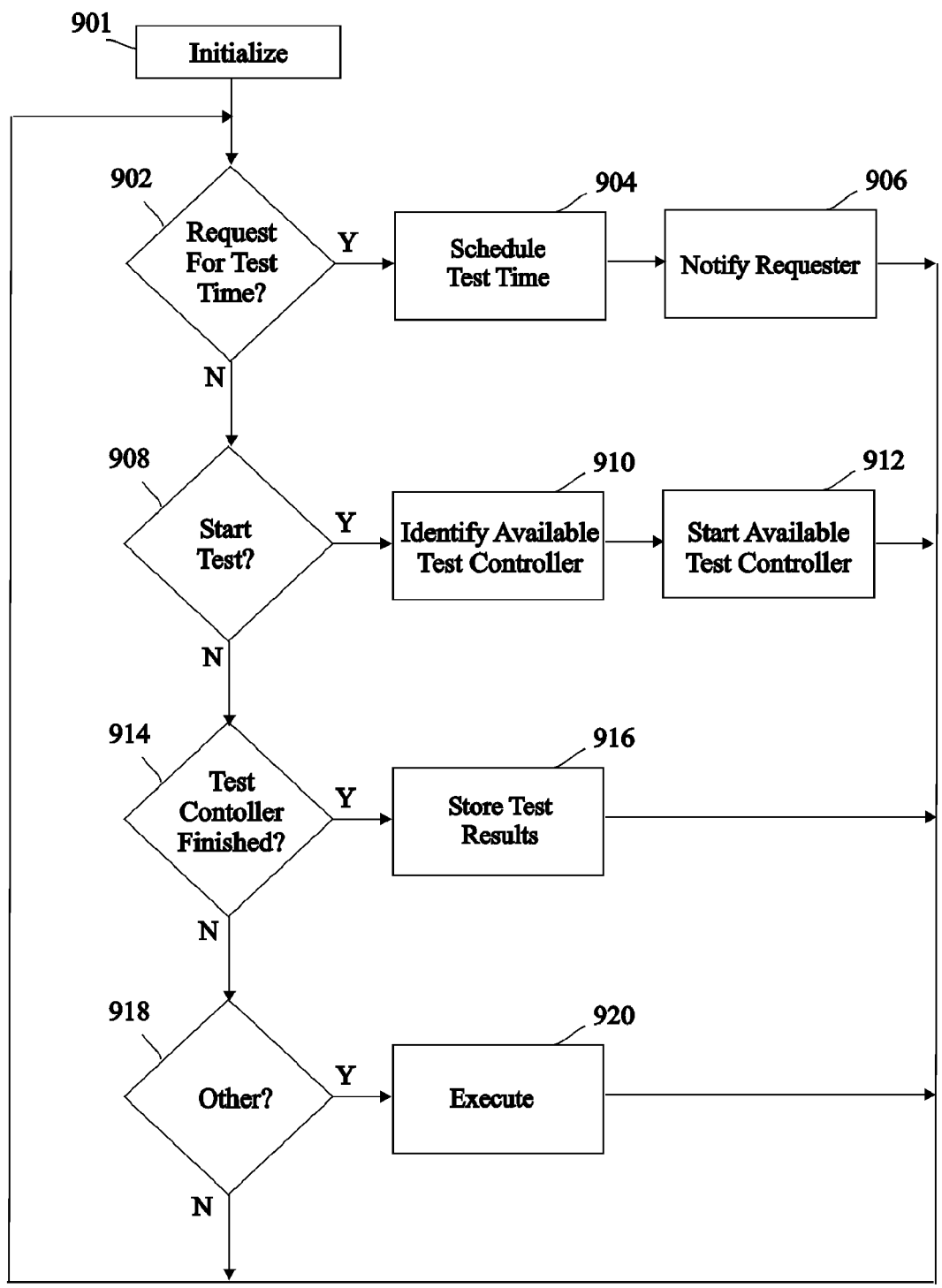
FIG. 9 illustrates exemplary operation of the main controller 802 of FIG. 8.
Figure 10:
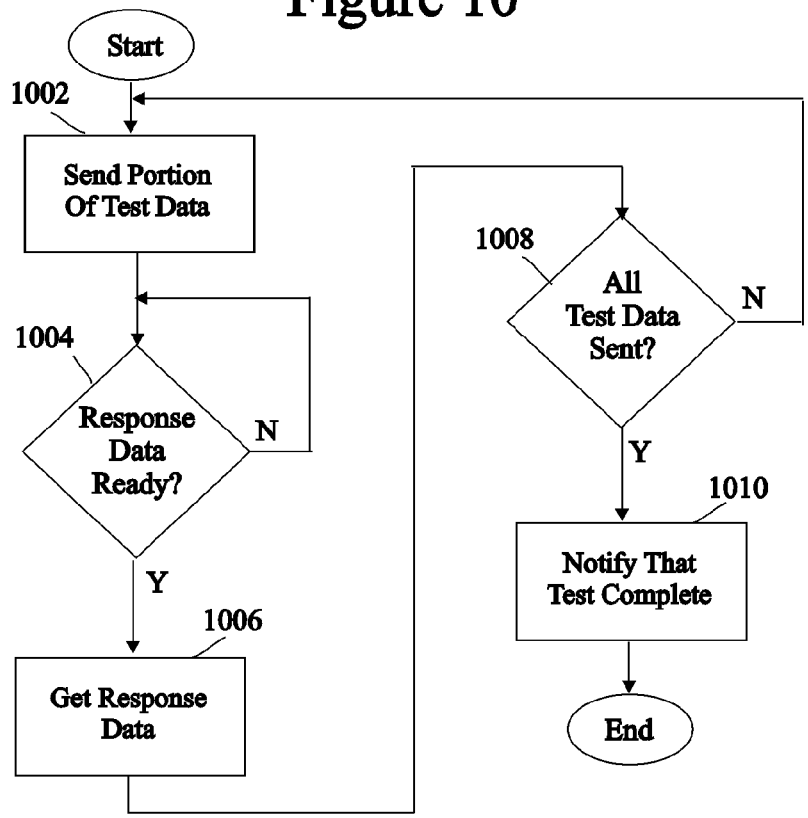
FIG. 10 illustrates exemplary operation of a test controller 808, 810, or 812 of FIG. 8.

FIG. 9 illustrates exemplary operation of the main controller 802 of central test facility. FIG. 10 illustrates exemplary operation of one of test controllers 808, 810, and 812. Preferably, test controllers 808, 810, and 812 operate independently of one another but nevertheless operate similarly. Local test facilities 706, 710, 714, and 718 also preferably operate independently of one other, and each may operate generally as local test facility 108 of FIG. 1 operates. As discussed above, exemplary operation of local test facility 108 of FIG. 1 is shown in FIG. 5.

FIG. 9 begins with initialization at step 901. As shown in FIG. 9, after initialization 901, a loop is processed in which main controller looks for and processes any of a variety of possible messages. Three exemplary messages are shown in FIG. 9: a request-for-test-time message (steps 902, 904, and 906), a start-test message (steps 908, 910, and 912), and a test-finished message (steps 914 and 916). Each of these exemplary messages and the way in which the messages are processed in FIG. 9 will now be described.

At step 902, main controller 802 determines whether a request-for-test-time message has been received from one of local test facilities 706, 710, 714, or 718. As mentioned above, each local test facility 706, 710, 714, or 718 may operate generally as shown in FIG. 5, and as generally shown in FIG. 5, when new dies are loaded into a local test facility (e.g., 706) for testing, the local test facility (e.g., 706) sends a request-for-test-time message to the central test facility 702. The request-for-test-time message may include a variety of information, including, for example, any of the following information: data identifying the local test facility (e.g., 706); the type of dies to be tested; the number of dies to be tested, an identifier identifying each die and its location relative to the other dies to be tested; a requested time for testing of the dies to begin; etc. If a request-for-test-time message is detected at step 902, main controller 802 branches to steps 904 and 906. At step 904, main controller 802 schedules a test time for testing the dies. If the time requested by the local test facility (e.g., 706) is available, main controller 802 schedules that time at step 904. Otherwise, main controller 802 schedules another time that is available at step 904. A particular time may be deemed unavailable if the available test resources (e.g., the number of test controllers 808, 810, and 812) would not be sufficient to perform all of the tests that, according to the schedule, will be on going at that time. For example, the exemplary central test facility 702 shown in FIG. 8 has three test controllers 808, 810, and 812 and is thus capable to controlling testing at three local test facilities at any given time.

Main controller 802 may maintain a schedule in a digital memory (e.g., in a table kept in storage 806 or another storage device (not shown)). Table III below illustrates an example of such a table, in which three exemplary test times are scheduled: test of "X" type dies at local test facility 1 706 to begin on Apr. 5, 2004 at 1:00 pm; a test of "Y" type dies at local test facility 3 714, also to be begin on Apr. 5, 2004 at 1:00 pm; and a test of "Z" type dies at local test facility 4 718, to begin on Apr. 9, 2004 at 9:00 am.

TABLE III

| Test Date | Test Time | Local Test Facility | Test Information |
|---|---|---|---|
| Apr. 5, 2004 | 1:00 pm | 1 | Die type X |
| Apr. 5, 2004 | 1:00 pm | 3 | Die type Y |
| Apr. 9, 2004 | 9:00 am | 4 | Die type Z |

Of course, other or additional information could be stored in such a table in storage 806. For example, additional information about the type of tests could be stored. For example, there may be multiple types of tests that may be run on a particular die type, and one or more such tests may be identified for each scheduled test time. Main controller 802 may schedule a test time for a requested test by creating a new entry in table III that corresponds to the requested test.

At step 906, main controller 802 sends a notice to the local test facility (e.g., 706) identifying the scheduled test time. Further, communications between the central test facility 702 and the local test facility (e.g., 706) may be made to confirm the requested test time, particularly if the scheduled test time is not the same as the time requested by the local test facility.

Main controller 802 determines at step 908 whether a start-test message is present. A start-test message is generated internally when it is time to start a scheduled test. For example, when the schedule of test times, as set at step 904, indicates that it is time to start a test, a start-test message is generated. There are any number of ways in which the schedule may be checked. For example, a sub-process (not shown) processing in the background on main controller 802 may periodically check the schedule (e.g., a table like table III above) and generate start-test messages as needed. As another example, rather than looking for a start-test message at step 908, main controller 802 may scan at step 908 the test schedule for tests that are scheduled to start. Regardless of how main controller 802 determines at step 908 whether it is time to start a scheduled test, if main controller 802 determines that it is time to start a test, main controller processes steps 910 and 912. At step 910, main controller 802 identifies an available tester controller 808, 810, or 812, and at step 912, main controller 802 starts that test controller. (Operation of a test controller is described below with respect to FIG. 9.)

At step 914, main controller 802 determines whether a test-controller-finished message is present. A test controller 808 generates such a message upon completing testing of dies started by the main controller 802 at step 912. If a test-controller-finished message is detected at step 914, main controller 802 collects and stores the results of the testing at step 916. For example, the results of the testing may be stored in storage 806. Alternatively or in addition, main controller 802 may transmit (e.g., via its transceiver 704) the results of the testing to another entity, such as the local test facility 706, 710, 714, or 718 at which the tests were performed. Alternatively, the test results may be transmitted to another entity not shown in FIG. 7. For example, one or more design facilities and/or manufacturing facilities, such as shown in FIG. 1, may be included in the system shown in FIG. 7, and the test results may be transmitted to such a facility or facilities as generally described above with respect to FIGS. 1-6.

It should be noted that raw response data generated by the dies being tested may be analyzed by any one or more of the local test facility 706, 710, 714, or 718 where the testing takes place, the test controller 808, 812, or 812 that controls the testing, or the main controller 802. Alternatively, an analyzer, such as the analyzer 314 shown in FIG. 3 may be included to analyze response data. Alternatively, the system of FIG. 7 may be configured such that none of the foregoing entities analyzes the raw response data. Thus, the test results stored (and/or also processed) at step 916 may be raw response data or the results of analyzing the raw response data.

Steps 918 and 920 represent detection and processing of other or miscellaneous messages, including a stop message and an interrupt message that ends and pauses, respectively, processing of the method shown in FIG. 9.

As mentioned above, FIG. 10 illustrates exemplary operation of any of test controllers 808, 810, and 812, which may be implemented in software operating on a microprocessor, hardwired logic, or a combination of software and hardwired logic. As also mentioned above, operation of a test controller begins when main controller 802 starts the test controller at step 912 of FIG. 9, and the main controller does so in order to implement testing of a particular type of die at a specified local test facility (e.g., 706). As shown in FIG. 10, the test controller (e.g., 808) sends at step 1002 to the local test facility a portion of the test data for testing the dies at the local test facility. The test controller may do so in a manner similar to that described above with respect to step 412 of FIG. 4. That is, the test data may be in any of many different forms. For example, the test data may be test vectors that include data to be written to specified locations on the dies. (See Table I above.) As another example, the test data may be test commands or a combination of test vectors and test commends.

As generally described above with respect to steps 506 and 508 of FIG. 5, the local test facility (e.g., 706) responds to the receipt of test data from a test controller (e.g., 808) by writing test data to the dies to be tested, and after the dies generate response data, sending the response data to the test controller (e.g., 808) (see, generally, steps 510 and 512 of FIG. 5). At step 1004, the test controller (e.g., 808) waits for response data generated by the dies in response to the test data sent at step 1002. As mentioned above, the response data may be raw response data generated by the dies or the results of an analysis of the raw response data performed, for example, at the local test facility (e.g., 706). Once response data is ready at the local test facility (e.g., 706), the test controller (e.g., 808) collects the response data at step 1006. At step 1008, the test controller (e.g., 808) determines at step 1008 whether all of the test data for testing the dies has been sent to the local test facility (e.g., 706). If not, the test controller (e.g. 808) repeats steps 1002, 1004, and 1006 until all of the test data for testing the dies has been sent and all of the response data generated by the dies collected, after which the test controller (e.g., 808) notifies at step 1010 the main controller 802 that testing is completed. The test controller (e.g., 808) may do so by generating a test-controller-finished message, which the main controller 802 detects at step 914 of FIG. 9 as discussed above.

Although not shown in FIGS. 7-10, one or more of each of a design facility and a manufacturing facility (e.g., similar to design facility 104 and manufacturing facility 106 in FIG. 1) may be included in the system shown in FIG. 7. Moreover, main controller 802 in FIG. 8 may be configured to send test results to any such design facility or manufacturing facility as generally shown in FIGS. 1-6 and described above.

It should again be apparent that all communications between the central test facility 702 and a local test facility (e.g., 706, 710, 714, or 718) may be accomplished wirelessly via transceiver 704 of the central test facility 702 and the transceiver (e.g., 708, 712, 716, or 720) of the local test facility.

Figure 11:
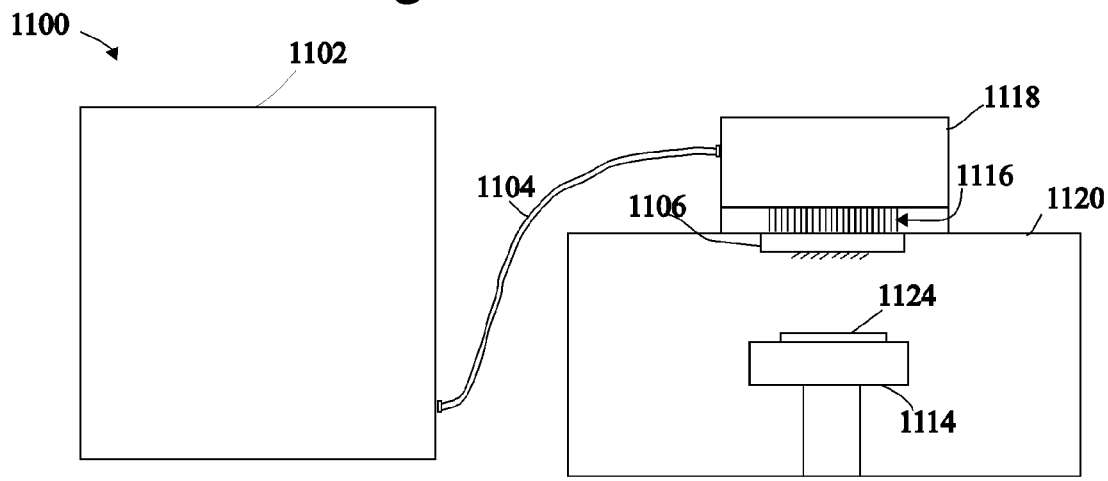
FIG. 11 illustrates a prior art system for probing semiconductor wafers.

FIG. 11 illustrates a simplified block diagram of a prior art probing system 1100 for probing and testing semiconductor wafers. As is generally know, a semiconductor wafer 1124 comprising newly manufactured dies (not shown) is placed on a moveable chuck 1114, which moves the wafer 1124 into contact with a probe card 1106, establishing temporary electrical connections with terminals of dies of the wafer. Temporary electrical paths are thus established between a semiconductor tester 1102 and the dies to be tested. The electrical paths between the tester 1102 and the dies of the wafer 1124 include a communications cable 1104, a probe head 1118, electrical connectors 1116, and the probe card 1106. The tester 1102 generates test data that is written to the dies of the wafer 1124, and the tester 1102 analyzes response data generated by the dies to determine whether the dies pass or fail the testing. Many other test systems are known in which a tester, which may be generally similar to tester 1102, is disposed in general proximity to a mechanism for holding and providing electrical connections to an electronic device to be tested. Examples of such electronic devices include singulated semiconductor dies (packaged or unpackaged), multi-die modules, printed circuit boards, etc.

Any of the local test facilities (e.g., 108 of FIG. 1 or 706, 710, 714, or 718 of FIG. 7) may include such test systems. The functions performed by the tester (e.g., 1102), however, may be fully or partially moved to the central test facility (102 in FIG. 1 or 702 in FIG. 7). This may, among other things, reduce the amount of equipment needed in the local test facilities (108 in FIG. 1 and 706, 710, 714, and 718 of FIG. 7), which may in turn, reduce the amount of floor space in a local test facility needed to test a given number of electronic devices.

Although exemplary embodiments and applications of the invention have been described herein, there is no intention that the invention be limited to these exemplary embodiments and applications or to the manner in which the exemplary embodiments and applications operate or are described herein. Indeed, many variations and modifications to the exemplary embodiments are possible. For example, although the embodiments described above test electronic devices, including semiconductor devices, the embodiments may be modified to test any type of electronic device or, indeed, any type of device, product, or manufacture. For example, the local test facilities may be modified to test a newly manufactured mechanical engine. In such a case, the central test facility could be modified to send test data for controlling the test equipment used to test the engines, and the central test facility could then collect response data showing the results of testing the engines.

What is claimed is:

1. A method for controlling testing of electronic devices, said method comprising:

wirelessly transmitting test data to a local test facility, said test data for testing ones of said devices;

receiving the test data at the local test facility, a test controller at said local test facility configured to utilize said test data to test a plurality of said devices at said local test facility;

wirelessly receiving results of testing said ones of said devices; and wirelessly transmitting test information regarding said results of said testing to at least one of a design facility where said devices are designed or a manufacturing facility where said devices are manufactured, only upon activation of a trigger.

2. The method of claim 1, wherein said trigger relates to cumulative results of testing said electronic devices.

3. The method of claim 1, wherein said trigger comprises completion of testing of a specified number of devices.

4. The method of claim 1, wherein said trigger comprises failure of a specified number of devices.

5. The method of claim 1 further comprising setting said trigger from said design facility or said manufacturing facility.

6. The method of claim 1 further comprising wirelessly transmitting from said design facility or said manufacturing facility information for setting said trigger.

7. The method of claim 1, wherein said test controller is separate and distinct from said devices.

8. The method of claim 1 further comprising wirelessly transmitting from said local test facility a request to test a plurality of devices introduced into said local test facility.

9. The method of claim 8, wherein said request comprises information identifying a type of said devices.

10. The method of claim 8, wherein said request comprises information identifying a time to start testing of said devices.

11. The method of claim 1 wherein said design facility or said manufacturing facility to which said test information is transmitted is located remotely from said local test facility.

12. The method of claim 1, wherein said wirelessly transmitting test data, said wirelessly receiving results of testing, and said wirelessly transmitting test information are performed at a central test facility located remotely from said local test facility.

13. The method of claim 1, wherein said test information is transmitted in real time.

14. The method of claim 1, wherein said electronic devices comprise semiconductor dies.

15. The method of claim 14, wherein said dies compose an unsingulated semiconductor wafer.

16. The method of claim 1 further comprising creating a design of said electronic devices at said design facility.

17. The method of claim 16 further comprising utilizing said test information to modify said design of said electronic devices.

18. The method of claim 16 further comprising manufacturing said electronic devices at said manufacturing facility.

19. The method of claim 18 further comprising utilizing said test information to modify manufacture of said electronic devices.

20. The method of claim 1 further comprising manufacturing said electronic devices at said manufacturing facility.

21. The method of claim 20 further comprising utilizing said test information to modify manufacture of said electronic devices.

22. An apparatus for controlling testing of electronic devices, said apparatus comprising:

first transmitting means for wirelessly transmitting test data to a local test facility, said test data for testing ones of said devices;

a test controller at said local test facility configured to utilize said test data to test a plurality of said devices at said local test facility;

receiving means for wirelessly receiving results of said testing of said ones of said devices; and second transmitting means for wirelessly transmitting test information regarding said results of said testing to at least one of a design facility where said devices are designed or a manufacturing facility where said devices are manufactured, only upon activation of a trigger.

23. The apparatus of claim 14, wherein said second transmitting means transmits said test information to one of said design facility or said manufacturing facility in real time.

24. The apparatus of claim 14, wherein said electronic devices comprise semiconductor dies.

25. The apparatus of claim 24, wherein said dies compose an unsingulated semiconductor wafer.

26. The apparatus of claim 22, wherein said trigger relates to cumulative results of testing said electronic devices.

27. The apparatus of claim 22, wherein said trigger comprises completion of testing a specified number of devices.

28. The apparatus of claim 22, wherein said trigger comprises failure of a specified number of devices.

29. The apparatus of claim 22 further comprising means for setting at said design facility or said manufacturing facility said trigger.

30. The apparatus of claim 22 further comprising means for wirelessly transmitting from said design facility or said manufacturing facility information for setting said trigger.

31. The apparatus of claim 22, wherein said test controller is separate and distinct from said devices.

32. The apparatus of claim 22 further comprising means for wirelessly transmitting from said local test facility a request to test a plurality of devices introduced into said local test facility.

33. The apparatus of claim 32, wherein said request comprises information identifying a type of said devices.

34. The apparatus of claim 32, wherein said request comprises information identifying a time to start testing said devices.

35. The apparatus of claim 22 wherein said design facility or said manufacturing facility to which said test information is transmitted is located remotely from said local test facility.

36. The apparatus of claim 22, wherein said first transmitting means, said receiving means, and said second transmitting means are located in a central test facility located remotely from said local test facility.

* * * * *